United States Patent

Pilo

(10) Patent No.: US 9,123,439 B2
(45) Date of Patent: Sep. 1, 2015

(54) SRAM WRITE-ASSISTED OPERATION WITH $V_{DD}$-TO-$V_{CS}$ LEVEL SHIFTING

(71) Applicant: International Business Machines Corporation, Armonk, NY (US)

(72) Inventor: Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 14/087,006

(22) Filed: Nov. 22, 2013

(65) Prior Publication Data

US 2015/0146479 A1 May 28, 2015

(51) Int. Cl.
G11C 11/00 (2006.01)
G11C 11/419 (2006.01)
G11C 11/412 (2006.01)
G11C 5/14 (2006.01)

(52) U.S. Cl.
CPC ............. *G11C 11/419* (2013.01); *G11C 5/145* (2013.01); *G11C 11/412* (2013.01)

(58) Field of Classification Search
None
See application file for complete search history.

(56) References Cited

U.S. PATENT DOCUMENTS

| | | | |
|---|---|---|---|
| 7,800,407 B1 | 9/2010 | Agarwal et al. | |
| 7,921,388 B2 | 4/2011 | Ehrenreich et al. | |
| 7,940,580 B2 | 5/2011 | Schreiber et al. | |
| 8,164,971 B2 | 4/2012 | Wang et al. | |
| 8,218,378 B2 | 7/2012 | Arsovski et al. | |
| 8,279,687 B2 | 10/2012 | Adams et al. | |
| 8,363,453 B2 | 1/2013 | Arsovski et al. | |
| 8,427,888 B2 | 4/2013 | Lu et al. | |
| 8,446,784 B2 | 5/2013 | Tanzawa | |
| 2011/0149661 A1 | 6/2011 | Rajwani et al. | |
| 2013/0128655 A1 | 5/2013 | Cheng et al. | |

*Primary Examiner* — Kretella Graham
(74) *Attorney, Agent, or Firm* — Stephen Darrow; David Cain

(57) ABSTRACT

An electronic circuit and a method for driving data writes to an SRAM bit cell in an electronic circuit. The electronic circuit translates a first write signal in a lower voltage domain to a second write signal in a higher voltage domain. Based, at least in part, on the second write signal, the electronic circuit controls a discharge of a voltage of a data write line to a ground voltage level. The electronic circuit provides a negative voltage boost to the data write line after the voltage of the data write line has been discharged to reach or exceed a threshold value relative to the ground voltage level.

17 Claims, 2 Drawing Sheets

SRAM WRITE-ASSISTED OPERATION WITH $V_{DD}$-TO-$V_{CS}$ LEVEL SHIFTING

FIELD OF THE INVENTION

The present invention relates generally to integrated circuit memory devices, and more particularly to static random access memory (SRAM) write-assist circuitry with voltage level shifting.

BACKGROUND OF THE INVENTION

Static random-access memory (SRAM) is a common type of semiconductor memory that uses bi-stable latching circuitry to store each bit of binary data (e.g., "0" or "1"). SRAM does not require periodic refreshing to maintain its data if left undisturbed. However, it is typically still volatile in that data is lost when power is removed. A conventional SRAM is composed of an array of individual SRAM bit cells, where each bit cell stores a single bit of data accessed by a pair of complementary bit lines known as bit line true (BLT) and bit line complementary (BLC). Each bit cell is in turn composed of a number of transistors which together store the bit itself and control access to it.

Problems have arisen in maintaining the functional integrity of SRAM bit cells as semiconductor memory technology continues to scale to smaller sizes, greater densities, and lower power schemes. In particular, the read and write margins of SRAM bit cells, which relate to how reliably the bits of the SRAM cells can be read from and written to, are reduced as operating voltages are reduced with the downscaling of circuit size. Reduced read and write margins may consequently cause errors with read and write operations of the SRAM cells.

SUMMARY

According to one aspect of the present disclosure, there is an electronic circuit and method to drive data writes to an SRAM bit cell in an electronic circuit. The electronic circuit translates a first write signal in a lower voltage domain to a second write signal in a higher voltage domain. The electronic circuit controls a discharge of a voltage of a data write line to a ground voltage level, wherein control of the discharge is based, at least in part, on the second write signal. The electronic circuit provides a negative voltage boost to the data write line after the voltage of the data write line has been discharged to reach or exceed a threshold value relative to the ground voltage level.

DETAILED DESCRIPTION

Figure 1:
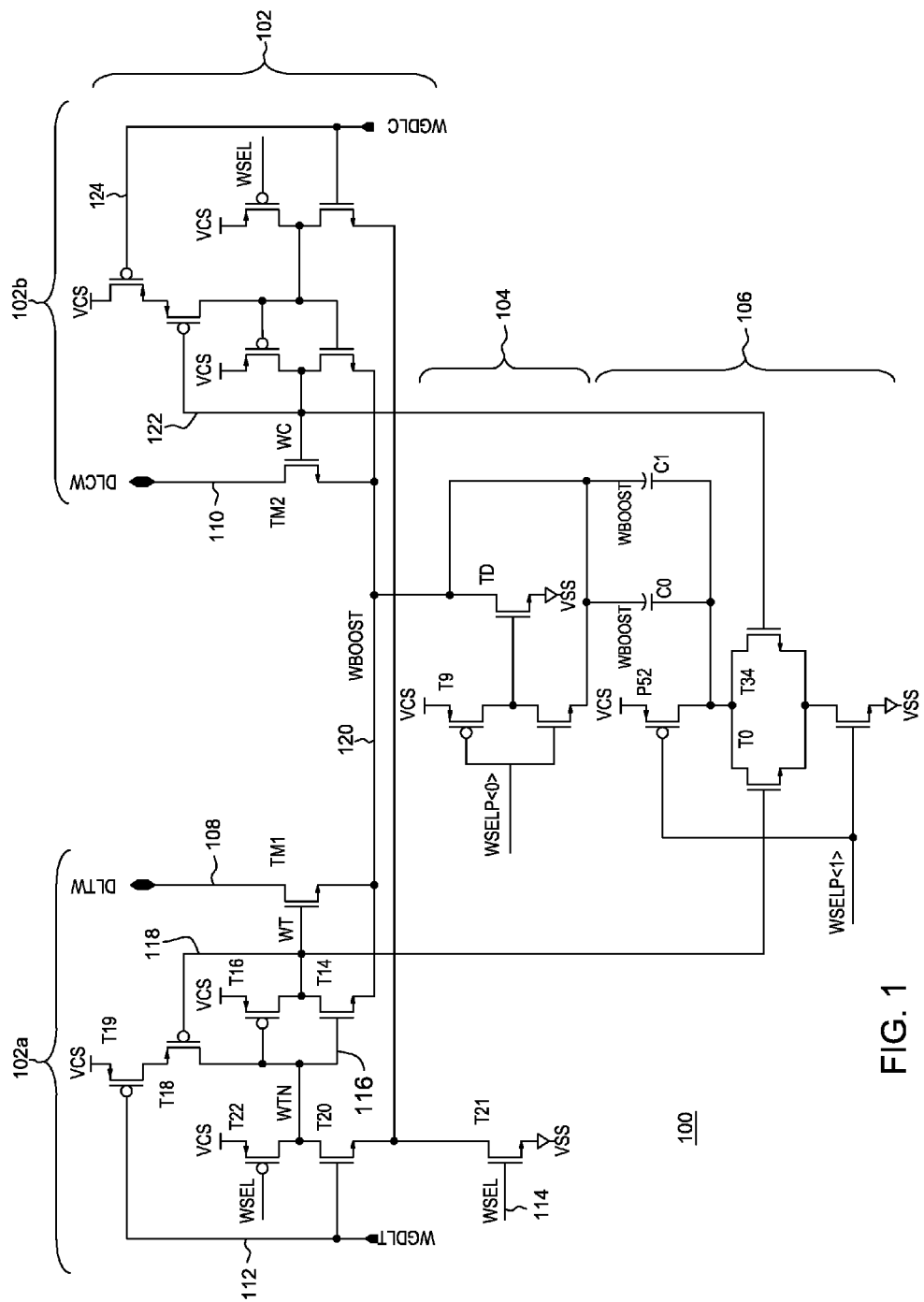
FIG. 1 is a schematic diagram of components of an SRAM write-assist circuit in accordance with an embodiment of the present invention.

Some embodiments of the present disclosure recognize that among the approaches used to deal with the problems associated with static random access memory (SRAM) scale-down are write-assist circuits. Since the minimum voltage ($V_{min}$) for reliable operation of an SRAM cell is not scaling as fast as the supporting logic, modern SRAMs are now operating with dual power supplies. Roughly speaking, one power supply operating at a lower voltage, $V_{DD}$ (e.g., 0.8 volts), is used to power the SRAM periphery, while another power supply operating at a higher voltage, $V_{CS}$ (e.g., 1.0 volts), is used to power the memory array, including the bit cells. Voltage level shifting is used to translate signals between these two voltage domains.

Write-assist circuits, or data write drivers, also support voltage scale-down by helping bit cells to change state during write operations, thus permitting reliable SRAM operation at a lower $V_{min}$ than would otherwise be possible. One popular write-assist technique is the negative bit-line write assist, whereby a bit line is provided with a negative voltage "boost" during a write operation that increases the strength of a bit cell's access transistor and thus increases the ability to reliably write to that bit cell.

The present disclosure teaches a circuit for voltage translation embedded in a data write driver. An embodiment of the circuit manages boost control by boost pre-charge and boost enablement based on data write masking. Level translation in the write driver improves the $V_{CS}$-to-$V_{DD}$ margin ($V_{diff}$) while removing $V_{DD}$ from the SRAM array circuitry. $V_{CS}$ overdrive provides faster write and $V_{CS}$ boost pre-charge provides more boost as compared to their respective $V_{DD}$-driven counterparts.

Some embodiments of the present disclosure recognize that negative bit-line write assist circuits exist that possess one or more of the following features, characteristics, and/or advantages: (i) negative boost voltage control at high voltages to minimize transistor overstress (i.e., boost magnitude is attenuated at relatively high voltages to avoid excessive voltage levels that can cause damage to circuit components); (ii) an interlock circuit to time boost initiation and thereby maximize boost effectiveness; (iii) feedback of negative boost voltage to unselected gates to isolate boost potential to the path of interest and thereby maximize boost effectiveness, especially at high temperatures; and/or (iv) data-driven boost cancellation during write operations, such that a voltage boost is only applied to the bit cell(s) selected for writing.

Some embodiments of the present disclosure recognize that existing schemes do not provide a write driver strong enough to produce reliable writes under all desired conditions (e.g., 22 nm, 8 Mb SRAM with $V_{CS}$=0.95V and $V_{DD}$=0.7V), where the weak write driver is associated with one or more of the following conditions: (i) low $V_{DD}$; (ii) no $V_{diff}$ margin; (iii) an early $V_{CS}$-driven read from the memory array during initial word line select not overcome by the later $V_{DD}$-driven write driver during the write cycle; (iv) a slow, $V_{DD}$-regulated bit line discharge (e.g., $V_{DD}$-driven using OR of data and clock), pushing the negative boost too late in the write cycle; and/or (v) a $V_{DD}$-based boost voltage (e.g., driven via a $V_{DD}$-charged boost capacitor) that is too weak at low $V_{DD}$.

Some embodiments of the present disclosure overcome these conditions while still preserving the desired functionality of existing circuits as detailed above. In particular, these embodiments possess one or more of the following features, characteristics, and/or advantages: (i) negative boost voltage control at high voltages to minimize transistor overstress; (ii) an interlock circuit to time boost initiation and maximize boost effectiveness; (iii) feedback of negative boost voltage to unselected gates to maximize boost effectiveness; (iv) data-driven boost cancellation during write operations; (v) $V_{CS}$-driven bit line discharge; (vi) $V_{CS}$-driven boost capacitor charge up; (vii) $V_{DD}$-free write driver, enabling $V_{DD}$ supply to be completely removed from the SRAM array core (see FIG. 3); and/or (viii) voltage level shifting from $V_{DD}$-driven global inputs to $V_{CS}$-driven array circuitry, thereby preserving input/output section performance, area, and/or power characteristics of the SRAM device by removing the need to level shift global data lines.

The present invention will now be described in detail with reference to FIG. 1. FIG. 1 is a schematic diagram illustrating SRAM bit cell differential write driver circuit 100, in accordance with one embodiment of the present invention. It is to be noted that some embodiments may take the form of integrated circuits, electronic circuits or other like devices which utilize the method(s) described herein, or incorporate the structure(s) described herein. Further, certain aspects of the method(s) and structure(s) described herein may be embodied as a computer program product or a computer system.

There are three sections to circuit 100: data line discharge control logic section 102; bit line ground ($V_{SS}$) discharge logic section 104; and boost capacitor charge logic section 106. Data line discharge control logic section 102 can be further subdivided into two sub-sections, 102a for data line true write (DLTW) 108, and 102b for data line complementary write (DLCW) 110. Because this write driver is differential, at most one of these two complementary data lines will be driven at any given time. These data lines drive writes to one or more SRAM bit cells through bit-switch transistors which connect to bit line true (BLT) and bit line complementary (BLC), respectively, of these SRAM cells (see FIGS. 2 and 3). The various sections of circuit 100 will now be discussed in greater detail.

Section 102a is a voltage level shifter for global write signal (write global data line) true (WGDLT) 112. When high, WGDLT 112 is at $V_{DD}$. When write select (WSEL) 114 is also high, N-type field effect transistor (NFET) T20 and NFET T21 are on, while P-type field effect transistor (PFET) T19 and PFET T22 are off. This brings control node write true negative (WTN) 116 to ground ($V_{SS}$). With WTN 116 at ground, PFET T16 is on while NFET T14 is off, bringing node write true (WT) 118 to $V_{CS}$. Thus, section 102a translates the lower $V_{DD}$-level write signal WGDLT 112 to the higher $V_{CS}$-level write signal WT 118. This allows NFET TM1 to be fully on, and permits a faster discharge of DLTW 108 than if WT 118 were at the lower $V_{DD}$ voltage level.

In more general terms, discharge of DLTW 108 is $V_{CS}$-driven through TM1 using a NAND plus INV (that is, a NOT AND followed by a NOT) logic structure in the voltage level shifter. Section 102a also contains a partially-broken feedback, or quasi-feedback, system that maintains control node WTN 116 at $V_{CS}$ via T18 in response to WGDLT 112 being de-activated. When DLTW 108 is the unselected data line of data line pair complements DLTW 108 and DLCW 110, control node WT 118 gets negative write boost (WBOOST) 120 (discussed further below) for complete shut-off of TM1. This permits a $V_{CS}$-based boost signal to be used while isolating boost potential to DLCW 110 and thus maximizing boost effectiveness. Section 102b works in an analogous fashion to section 102a, shifting write global data line complementary (WGDLC) 124 from a $V_{DD}$-based signal to a $V_{CS}$-based signal at node write complementary (WC) 122 to control discharge of DLCW 110 via NFET TM2.

Section 104 of write driver circuit 100 contains the bit line ground ($V_{SS}$) discharge logic. When activated via a low signal (write-assist control bit) WSELP<0>, data line DLTW 108 or DLCW 110, selected via circuit section 102 as described above, discharges to ground via node WBOOST 120 and NFET TD. The discharge is $V_{CS}$ driven through PFET T9, and shuts off before boost capacitors C0 and C1 are discharged when WSELP<0> goes high.

Section 106 of write driver circuit 100 contains the boost capacitor charge logic. A low write-assist control bit WSELP<1> charges boost capacitors C0 and C1. This is a $V_{CS}$-based charge, applied via PFET P52, so the boost potential is greater than that from a $V_{DD}$-based boost circuit. Capacitors C0 and C1 are discharged with a high WSELP<1> signal to provide a negative write boost to the selected data line DLTW 108 or DLCW 110 via WBOOST 120. The WSELP<1> signal is timed to trigger the negative boost only after the voltage of the data write line has been discharged to reach or exceed a threshold value relative to the ground voltage level. In some embodiments, the threshold is defined as an absolute voltage difference from the ground voltage level, such as 25 mV. In other embodiments, the threshold is defined as a percentage value of the peak voltage to the ground voltage. More generally, the threshold is defined such that the discharge of the data write line to ground voltage level is substantially complete before the negative boost is triggered.

The greater negative boost from the higher $C_{CS}$-based boost charge, as opposed to a $V_{DD}$-based boost charge, helps ensure reliable writes occur to the bit cell(s) attached to data lines DLTW 108 and DLCW 110. The section 106 charge logic is differential, meaning that the boost discharge will only occur if either of data lines DLTW 108 or DLCW 110 is selected for writing. This selection occurs via nodes write true (WT) 118 and write complementary (WC) 122 controlling circuit subsection 106 via NFETs T0 and T34, respectively. When neither data line is selected for writing, both T0 and T34 are turned off, so there is no path to $V_{SS}$ through which the discharge of capacitors C0 and C1 can occur. Because write driver circuit 100 uses only a $V_{CS}$ power supply, $V_{DD}$ is not needed for this circuit and can therefore be completely removed from the SRAM core.

Figure 2:
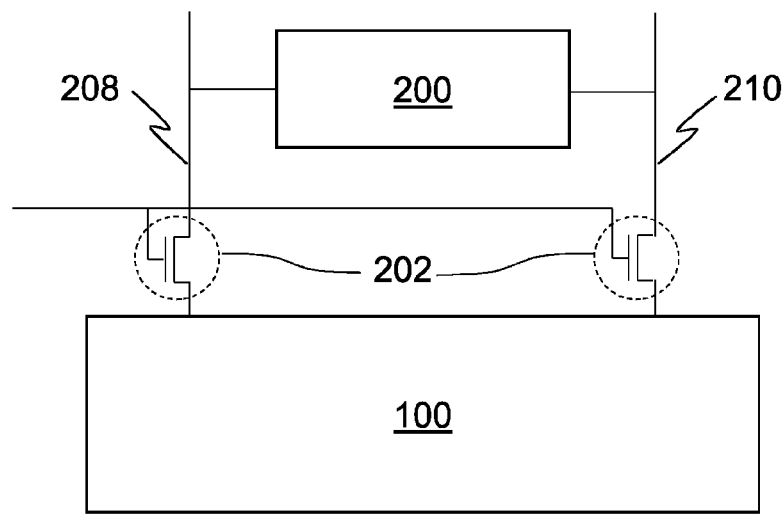
FIG. 2 is a schematic diagram of the SRAM write-assist circuit in the context of an SRAM bit cell in accordance with an embodiment of the present invention.

Shown in FIG. 2 is SRAM bit cell differential write driver circuit 100 (see FIG. 1) in the context of bit cell 200. DLTW 108 and DLTC 110 (see FIG. 1) drive writes to bit cell 200 through bit line true (BLT) 208 and bit line complementary (BLC) 210, respectively, via bit-switch transistors 202.

Figure 3:
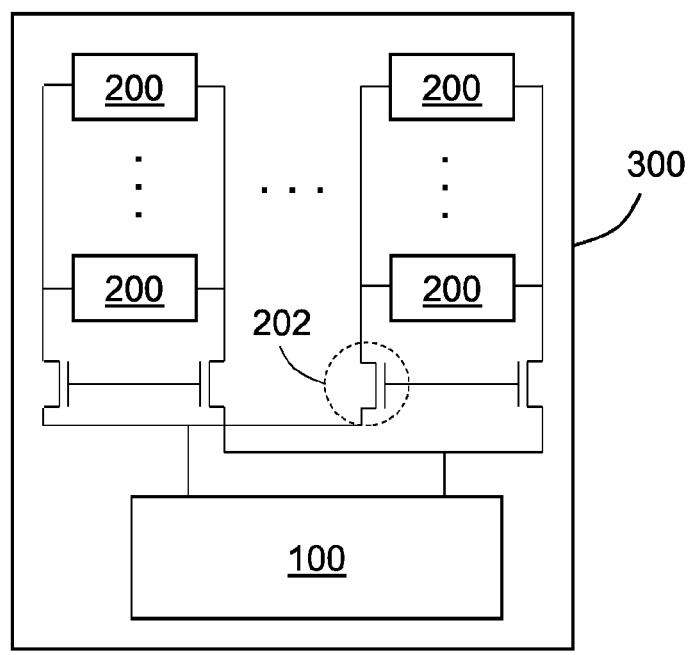
FIG. 3 is a schematic diagram of the SRAM write-assist circuit in the context of an SRAM array core in accordance with an embodiment of the present invention.

Shown in FIG. 3 is SRAM bit cell differential write driver circuit 100 (see FIG. 1) in the context of SRAM array core 300, where SRAM array core 300 includes multiple bit cells 200 to which circuit 100 is capable of driving writes (via bit-switch transistors 202).

In some embodiments, the $V_{CS}$-based write driver circuit possesses one or more of the following characteristics, features, and/or advantages over comparable $V_{DD}$-based circuits: (i) data lines fully discharge to ground before a negative boost is applied; (ii) data lines discharge to ground more quickly; (iii) the negative boost achieves a greater voltage differential; (iv) the maximum negative voltage is achieved more quickly; (v) higher reliability is achieved; and/or (vi) faster operation is possible.

Embodiments of the present invention may be used in a variety of electronic applications, including but not limited to advanced sensors, memory/data storage, semiconductors, microprocessors and other applications.

Having described an embodiment of an SRAM write-assist circuit with voltage level shifting (which is intended to be illustrative and not limiting), it is noted that modifications and variations may be made by persons skilled in the art in light of the above teachings.

The resulting integrated circuit chips (that incorporate one or more such write-assist circuits) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later come to be known to those of ordinary skill in the art are expressly incorporated herein by reference and intended to be encompassed by the invention. It is therefore to be understood that changes may be made in the particular embodiments disclosed which are within the scope of the present invention as outlined by the appended claims.

What is claimed is:

1. A method of driving data writes to an SRAM bit cell in an electronic circuit, the method comprising:
    translating, by an electronic circuit, a first write signal in a lower voltage domain to a second write signal in a higher voltage domain;
    controlling, by the electronic circuit, a discharge of a voltage of a data write line to a ground voltage level, wherein control of the discharge is based, at least in part, on the second write signal; and
    providing, by the electronic circuit, a negative voltage boost to the data write line after the voltage of the data write line has been discharged to reach or exceed a threshold value relative to the ground voltage level.

2. The method of claim 1, wherein the electronic circuit further comprises a differential write driver in which at most one of two complementary data write lines is selected for writing.

3. The method of claim 1, wherein translation of the first write signal to the second write signal includes utilization of a partially-broken feedback system to isolate an unselected data write line from the negative voltage boost.

4. The method of claim 3, wherein the negative voltage boost is applied only if at least one of the two complementary data write lines is selected for writing.

5. The method of claim 1, wherein the negative voltage boost is applied by a driver in the higher voltage domain of the electronic circuit.

6. The method of claim 1, wherein the electronic circuit, and an SRAM array core that includes a plurality of SRAM bit cells to which writes are driven by the electronic circuit, does not contain a power supply for the lower voltage domain.

7. The method of claim 1, wherein the translation is performed using a NAND plus INV logical circuit structure.

8. The method of claim 2, wherein the translation for one of the two complementary data write lines is performed by a first electronic circuit subsystem and the translation for another of the two complementary data write lines is performed by a second electronic circuit subsystem.

9. An electronic circuit comprising:
    a first circuit component configured to translate a first write signal in a lower voltage domain to a second write signal in a higher voltage domain;
    a second circuit component configured to control a discharge of a voltage of a data write line to a ground voltage level, wherein control of the discharge is based, at least in part, on the second write signal; and
    a third circuit component configured to provide a negative voltage boost to the data write line after the voltage of the data write line has been discharged to reach or exceed a threshold value relative to the ground voltage level.

10. The circuit of claim 9, wherein the electronic circuit further comprises a differential write driver in which at most one of two complementary data write lines is selected for writing.

11. The circuit of claim 9, wherein translation of the first write signal to the second write signal includes utilization of a partially-broken feedback system to isolate an unselected data write line from the negative voltage boost.

12. The circuit of claim 11, wherein the negative voltage boost is applied only if at least one of the two complementary data write lines is selected for writing.

13. The circuit of claim 9, wherein the negative voltage boost is applied by a driver in the higher voltage domain of the electronic circuit.

14. The circuit of claim 9, wherein the electronic circuit, and an SRAM array core that includes a plurality of SRAM bit cells to which writes are driven by the electronic circuit, does not contain a power supply for the lower voltage domain.

15. The circuit of claim 9, wherein the first circuit component employs a NAND plus INV logical circuit structure to perform the translation.

16. The circuit of claim 10, wherein the first circuit component is composed of a first subsystem to perform the translation for one of the two complementary data write lines and a second subsystem to perform the translation for another of the two complementary data write lines.

17. An electronic circuit comprising:
    a first circuit component configured to translate a first write signal in a lower voltage domain to a second write signal in a higher voltage domain;

a second circuit component configured to control a discharge of a voltage of a data write line to a ground voltage level, wherein control of the discharge is based, at least in part, on the second write signal; and a third circuit component configured to provide a negative voltage boost to the data write line after the voltage of the data write line has been discharged to reach or exceed a threshold value relative to the ground voltage level;

wherein:

translation of the first write signal to the second write signal includes utilization of a partially-broken feedback system to isolate an unselected data write line from the negative voltage boost;

the negative voltage boost is applied only if at least one of two complementary data write lines is selected for writing;

the negative voltage boost is applied by a driver in the higher voltage domain of the electronic circuit; and the electronic circuit, and an SRAM array core that includes a plurality of SRAM bit cells to which writes are driven by the electronic circuit, does not contain a power supply for the lower voltage domain.

\* \* \* \* \*